United States Patent
Audette et al.

(10) Patent No.: US 9,086,433 B2
(45) Date of Patent: Jul. 21, 2015

(54) RIGID PROBE WITH COMPLIANT CHARACTERISTICS

(71) Applicant: International Business Machines Corporation, Armonk, NY (US)

(72) Inventors: David M. Audette, Colchester, VT (US); Dustin Fregeau, South Burlington, VT (US); David L. Gardell, Fairfax, VT (US); Grant W. Wagner, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 13/720,092

(22) Filed: Dec. 19, 2012

(65) Prior Publication Data

US 2014/0167801 A1  Jun. 19, 2014

(51) Int. Cl.
  *G01R 31/20* (2006.01)
  *G01R 1/067* (2006.01)
  *G01R 1/073* (2006.01)

(52) U.S. Cl.
  CPC ........ *G01R 1/06738* (2013.01); *G01R 1/06727* (2013.01); *G01R 1/06733* (2013.01); *G01R 1/07314* (2013.01)

(58) Field of Classification Search
  None
  See application file for complete search history.

(56) References Cited

U.S. PATENT DOCUMENTS

| | | | |
|---|---|---|---|
| 5,286,208 A * | 2/1994 | Matsuoka | 439/72 |
| 6,830,461 B2 * | 12/2004 | Sakamoto et al. | 439/66 |
| 6,956,389 B1 | 10/2005 | Mai | |
| 7,579,856 B2 * | 8/2009 | Khandros et al. | 324/755.07 |
| 7,589,547 B2 * | 9/2009 | Ismail | 324/755.07 |
| 7,861,316 B2 * | 12/2010 | van der Weide et al. | 850/60 |
| 8,307,461 B2 * | 11/2012 | Li et al. | 850/40 |
| 2002/0008530 A1 | 1/2002 | Kim, II et al. | |
| 2002/0153912 A1 * | 10/2002 | Di Stefano | 324/754 |
| 2003/0155940 A1 | 8/2003 | Lee et al. | |
| 2004/0246010 A1 | 12/2004 | Di Stefano | |
| 2007/0062264 A1 * | 3/2007 | Wang et al. | 73/105 |
| 2007/0240306 A1 * | 10/2007 | Ismail et al. | 29/874 |
| 2007/0257692 A1 * | 11/2007 | Yakabe et al. | 324/762 |
| 2008/0001102 A1 * | 1/2008 | Hoshino et al. | 250/492.2 |
| 2008/0024154 A1 | 1/2008 | Beaman et al. | |
| 2008/0074132 A1 | 3/2008 | Fan et al. | |
| 2008/0229577 A1 | 9/2008 | Heck | |

(Continued)

FOREIGN PATENT DOCUMENTS

JP    2001124799 A    5/2001
WO   2010096711 A2   8/2010

OTHER PUBLICATIONS

International Search Report and Written Opinion for PCT Application No. PCT/US2013/057968, dated Dec. 11, 2013, pp. 1-15.

*Primary Examiner* — Paresh Patel
(74) *Attorney, Agent, or Firm* — Cantor Colburn LLP; Michael LeStrange

(57) ABSTRACT

A probe conducts testing of a circuit. The probe includes a base coupled to a substrate. The probe also includes a cantilever attached to the base at a first end, the cantilever deflecting from a first position to a second position in which a second end opposite the first end is in contact with the substrate and to move between the second position and the first position based on movement of a compliant bump of the circuit, and a probe tip attached to the cantilever at the second end, the probe tip maintaining contact with the compliant bump of the circuit.

15 Claims, 5 Drawing Sheets

(56) References Cited

U.S. PATENT DOCUMENTS

| | | |
|---|---|---|
| 2009/0128180 A1 | 5/2009 | Kim et al. |
| 2009/0151159 A1 | 6/2009 | Lee |
| 2010/0134131 A1 | 6/2010 | Chen et al. |
| 2011/0148449 A1 | 6/2011 | Williams et al. |
| 2012/0206609 A1* | 8/2012 | Datskos et al. ............... 348/180 |
| 2013/0082729 A1* | 4/2013 | Fan et al. ................. 324/755.07 |

* cited by examiner

RIGID PROBE WITH COMPLIANT CHARACTERISTICS

BACKGROUND

The present invention relates to wafer probing, and more specifically, to fine pitch probing of high power integrated circuits with compliant bumps.

Controlled collapse chip connection (C4) is a method that interconnects semiconductor devices such as integrated circuits of a wafer with solder bumps. Semiconductor devices are typically tested in wafer form before dicing into individual chips for further packaging, test, and sale. For high powered devices, hundreds or thousands of solder bumps or pads on the chip are brought into contact with a wafer probe system attached to a test system. The wafer probe system has corresponding probe tips that make electrical connections to respective pads or solder bumps.

Two types of probe systems have been in use, compliant and rigid systems. Compliant probes are designed as springs, often in the form of a cantilever, buckling beam, or coil spring. The spring has the requisite force to break thru surface oxides and initiate electrical contact with a compliant bump or other pad, but needs to be relatively long in order to achieve the desired compliance to overcome non-planarities between the bumps and probes (i.e., the fact that all the bumps are not equidistant from corresponding probes). Thus, this type of probe is limited by the proximity of pads for which it can be used. Compliant probes also tend to be relatively expensive for large arrays, and the longer length results in poor electrical performance (inductance and resistance) and overheating at high currents.

Rigid probes, such as a Thin Film Interposer (TFI) probe presented Jun. 6, 2007 at Southwest test Conference, are much shorter and relatively less expensive than compliant probes, but rely on the compliance (deformation) of the bumps to overcome non-planarities and make full contact to large arrays. Although the test chip would ideally be stationary during testing to prevent a loss of connection with the probe, various testing elements cause thermal and mechanical stresses during test that result in unwanted movement of the chip under test or probes. For example, during the various tests, the probe forces current through the solder bumps. The current flow causes temperature changes. This temperature change and resultant dynamics are generally more pronounced for higher power chips. This movement can cause loss of electrical contact when rigid probes are used to test plastically compliant bumps such as solder bumps.

SUMMARY

According to one embodiment of the present invention, a probe to conduct testing of a circuit includes a base coupled to a substrate; a cantilever attached to the base at a first end, the cantilever configured to deflect from a first position to a second position in which a second end opposite the first end is in contact with the substrate and to move between the second position and the first position based on a movement of a compliant bump of the circuit; and a probe tip attached to the cantilever at the second end, the probe tip configured to maintain contact with the compliant bump of the circuit.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, wafer probing, especially of high power chips with compliant bumps tested with rigid probes, is susceptible to loss of connection between the chip and the probe due to insufficient elastically compliant characteristics of the probe and bump. Further, wafer probing with compliant probes limits the pitch (compliant bump density) that can be tested. Embodiments of the invention described herein disclose a probe and a method of probing that address the need to maintain electrical contact between the probe and the solder bump during wafer testing. While C4 interconnects with solder bumps are discussed specifically herein, the probe and probing method discussed in the embodiments below apply to any compressible bumped or column structures. As detailed herein, embodiments of the probe supply sufficient force to deform the solder bumps and initiate electrical contact, yet include compliant characteristics such that the probe follows any movement of the chip to maintain contact during testing. Embodiments of the probe are also compact enough to fit between adjacent C4s and are sufficiently cost effective for chips with a large number of contacts.

Figure 1:
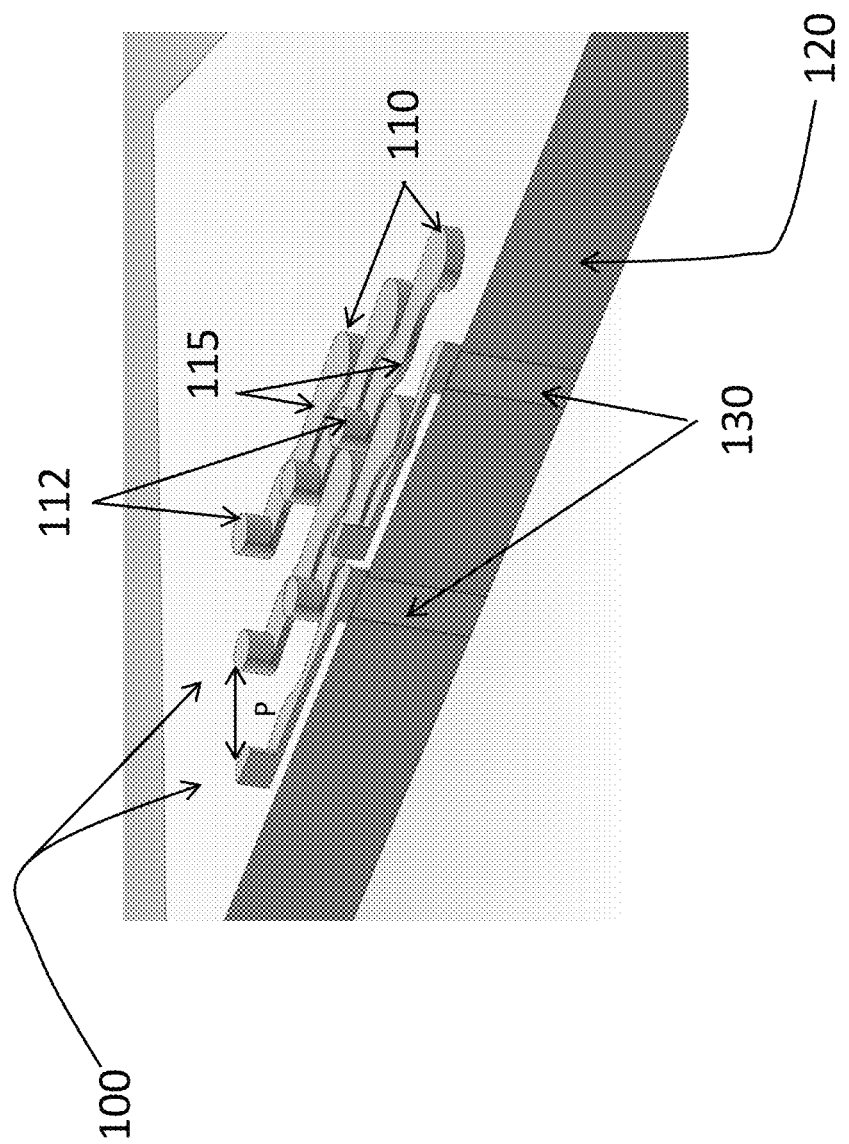
FIG. 1 depicts an array of probes according to an embodiment of the invention.
Figure 2:
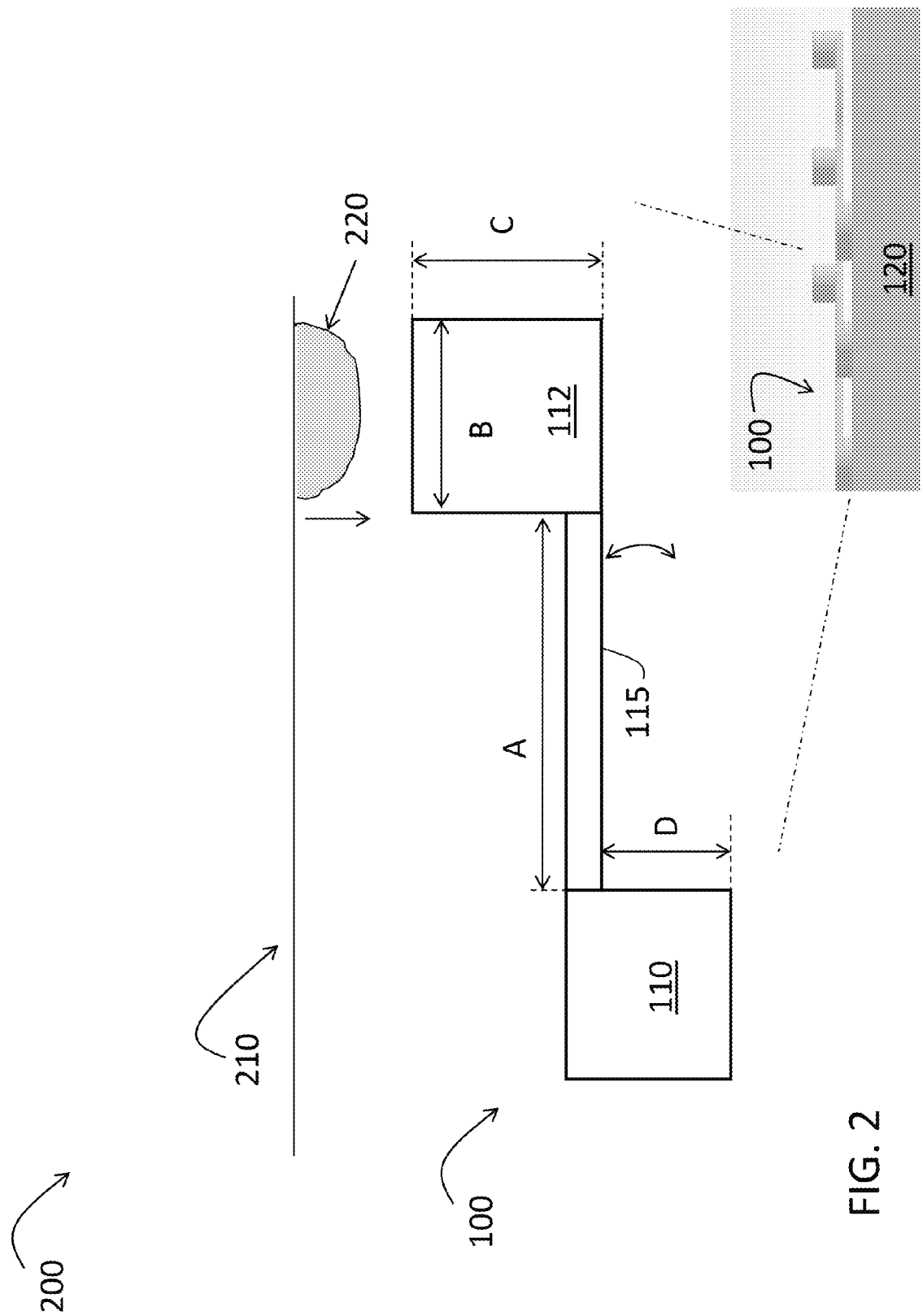
FIG. 2 is a cross-sectional view of a wafer test system according to an embodiment of the invention.

FIG. 1 depicts an array of probes 100 according to an embodiment of the invention. The probes 100 are shown on a substrate 120 with via connections 130. The substrate may be silicon, ceramic, organic, or another suitable material. The via connections 130 may carry current supply to the probes 100 to be applied to the solder bumps 220 (FIG. 2). Each probe 100 includes a base 110, a probe tip 112, and a cantilever 115 that connects the base 110 and the probe tip 112. As shown in FIG. 1, an exemplary probe tip 112 and an exemplary base 110 may be cylindrical in shape. The surface of the probe tip 112 that makes contact with the solder bump 220 may have patterns (not shown) built into the probe tip 112. The pattern can help to disturb any oxide or contamination on the solder bump 220 to initiate the contact. The pattern may be, for example, pyramidal or smaller cylindrical pattern atop a relatively larger cylindrical pattern. The material forming the probe tip 112 affects its size and shape. That is, a probe tip 112 made of a relatively strong material can be relatively smaller than a probe tip 112 made of a relatively weaker material and still apply the necessary force to the solder bump 220 to initiate contact. In addition, the material forming the probe tip 112 may be based on the material forming the compliant bump (e.g., solder bump 220). For example, if the solder bump 220 is made of tin, then a probe tip 112 made of copper (of a sufficient size and shape) will deform the solder bump 220 to make contact. However, a tin probe tip 112 would not sufficiently deform a copper compliant bump, for example.

The cantilever 115 between the base 110 and the probe tip 112 may have a rectangular shape or may have a curved shape to accommodate adjacent probes 100. The distance between the probes 100 must correspond with the distance between solder bumps 220, which is referred to as the pitch (P). Because different chips under test 210 (FIG. 2) or even different solder bumps 220 on the same chip have different distances between the solder bumps 220, the pitch (P) is one of the parameters that may be customized for compatibility with a given chip under test 210. A typical pitch may be, for example, between 25 and 200 micrometers (μm). However, as shown by FIG. 2, for example, the cantilever 115 length may be shorter or longer than the pitch. This is because of the offset in probe tips 112 between adjacent rows of probes 100. That is, the distance between probe tips 112 on the same plane (the two probe tips 112 connected by the line labeled P in FIG. 1, for example) must match the pitch in order to have a probe tip 112 correspond with each solder bump 220. However, this does not necessitate any particular cantilever length 115 because probe tips 112 on the same plane matching the pitch is not affected by the length of a cantilever 115. The cantilever 115 length must be sufficient to provide the flexibility to bend back to contact the substrate 120 and also sufficient to have enough force to move back toward its initial position to follow the movement of the solder bump 220 as needed. Further, the cross section of the cantilever 115 must be sufficient to carry the amount of current needed for testing from the vias 130 through the base 110 to the probe tip 112.

FIG. 2 is a cross-sectional view of a wafer test system 200 according to an embodiment of the invention. A perspective side view of the probes 100 on a substrate 120 is also shown in FIG. 2 (bottom right). The chip under test 210 is shown with one solder bump 220 for simplicity, but it should be understood that a typical chip under test 210 would generally have many solder bumps 220 with a given distance between them (pitch) that dictates the distance between the probes 100. The base 110 of each probe 100 is coupled to the probe tip 112 via a cantilever 115. The length (A) of the cantilever 110, the diameter (B) of the probe tip 112 (assuming a cylindrical exemplary probe tip 112), the height (C) of the probe tip 112, and the height (D) of the base 110 are all customizable and contribute to the predetermined and desired rigidity and compliance of the probe 100. For example, each of the parameters may be different based on the corresponding circuit under test 210. The height D of the base 110 may determine the maximum deflection of the probe 100, which is driven by the expected thermal movement of the substrate 120 or solder bump 220. That is, the cantilever 115 can flex (as indicated by the arrows) as the circuit under test 210 is lowered to initiate contact between the probe tip 112 and the solder bump 220, but the cantilever 115 will stop bending when the probe tip 112 contacts the substrate 120 (FIG. 1) at a deflection equal to the height D of the base 110. Other embodiments of the probe 100 in which the maximum deflection of the cantilever 115 is greater than or less than the height of the base 110 are discussed with reference to FIGS. 3 and 4 below. As noted above, the length, thickness, and width of the cantilever 115 must be such that the cantilever 115 has sufficient strength to flex back (down in the orientation shown in FIG. 2) to initiate contact yet flex back up to follow any movement of the solder bump 220. The length A of the cantilever 115 may be, for example, 25-500 μm. The diameter B of the probe tip 112 is selected to ensure clearance for adjacent probes 100 used in a fine pitch circuit under test 210. As noted above, the diameter B of the probe tip 112 is also based on the material it is made from (versus the material of the solder bump 220).

Figure 3:
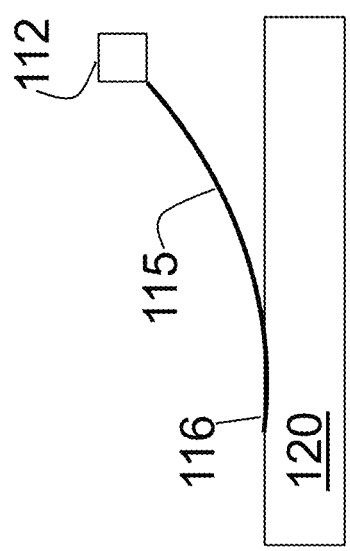
FIG. 3 is a perspective side view of a probe according to an embodiment of the invention.

FIG. 3 is a perspective side view of a probe 100 according to an embodiment of the invention. According to the present embodiment, the cantilever 115 may be directly coupled to the substrate 120 rather than through a base 110. Alternatively, the base 110 may be regarded as that portion of the cantilever (116) connected to the substrate 120. Even if the cantilever were coupled to the substrate 120 through a base 110, the cantilever 115 according to the present embodiment angles up (according to the orientation shown in FIG. 3) and would not be on the same plane as the top of the base (as shown in FIG. 2, for example). Thus, the maximum deflection of the cantilever 115 would be greater than the height of the base 110.

Figure 4:
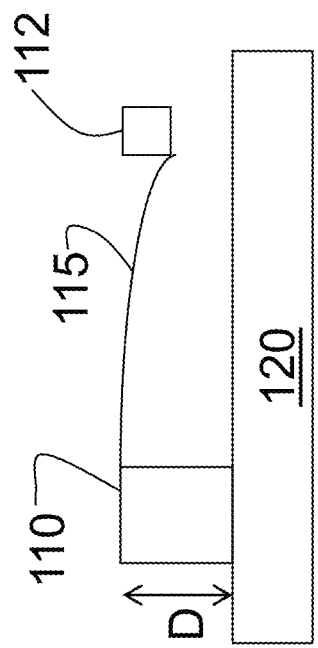
FIG. 4 is a perspective side view of a probe according to an embodiment of the invention.

FIG. 4 is a perspective side view of a probe 100 according to an embodiment of the invention. In this case, the cantilever 115 is coupled to the substrate 120 through a base 110 but the cantilever 115 is angled down (according to the orientation shown in FIG. 4) such that the maximum deflection of the cantilever 115 (before the probe tip 112 rests on the substrate 120) is less than the height (D) of the base 110.

Figure 5:
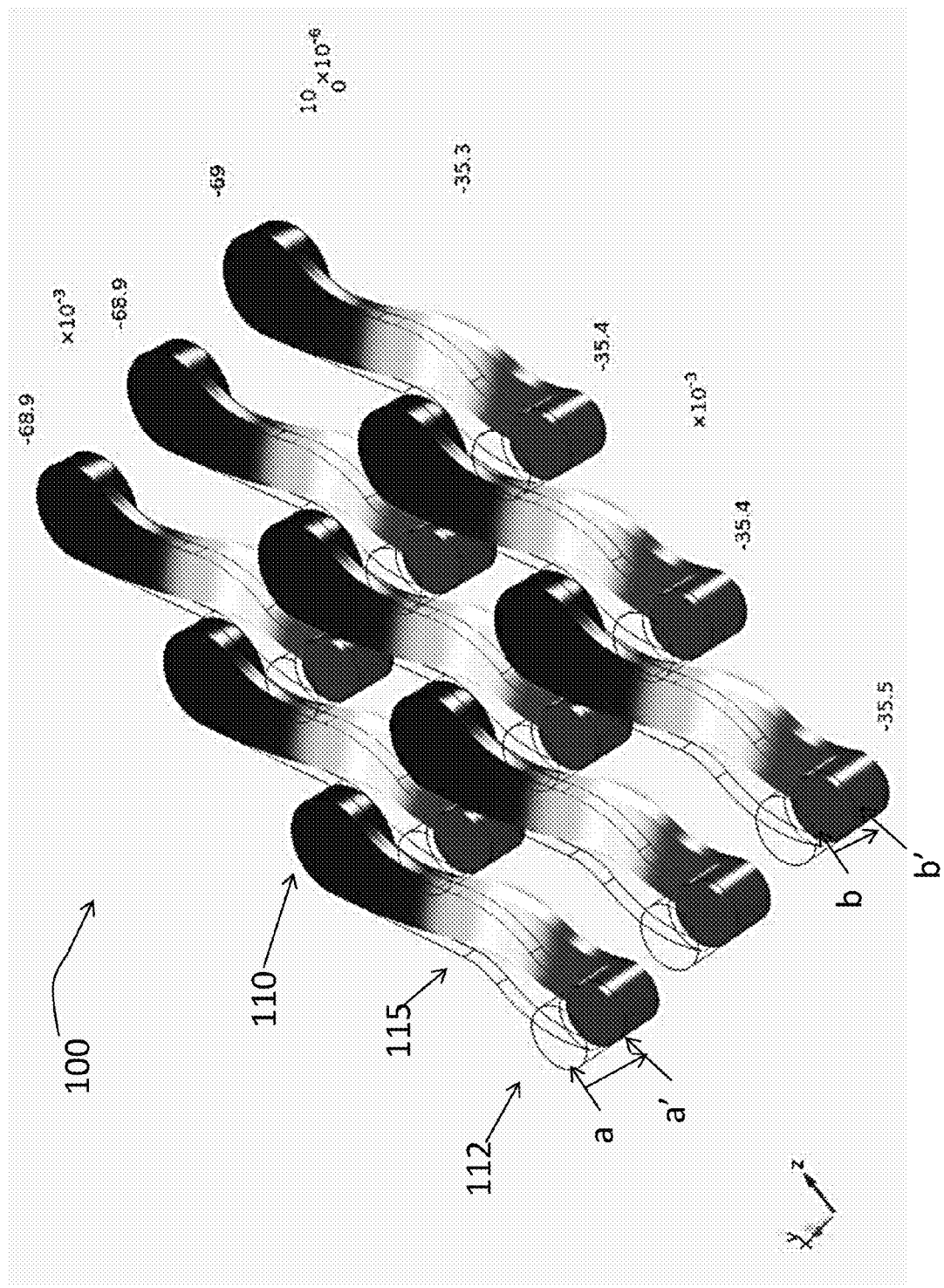
FIG. 5 illustrates the deflection of the probes according to an embodiment of the invention.

FIG. 5 illustrates the deflection of the probes 100 according to an embodiment of the invention. As shown, the probe tip 112 and cantilever 115 may be pushed down from an initial position (a) to a deflected position (a'). The force needed for deflection of the cantilever 115 and probe tip 112 may be on the order of 0.1-3 grams per probe 100, for example. As shown in exemplary FIG. 3, the deflection of the probe tip 112 is 3 μm. This small mechanical force between the solder bump 220 and probe tip 112 is insufficient to break thru the oxides and make reliable electrical contact. After the probe tip 112 contacts the substrate 120, the probe 100 force (force applied by the probe tip 112 up into a solder bump 220) can increase to sufficient levels (10 to 40 gms) to deform the solder bump 220 and, thereby make electrical contact without causing any damage to the probe. To be clear, when all the probes 100 are considered together, the wafer probing is initiated in the following way. All of the cantilevers 115 of all of the probes 100 flex back (toward the substrate 120) until all of the probe tips 112 contact the substrate 120. Contact force between every probe tip 112 and corresponding solder bump 220 is increased from this position to ensure that every probe tip 112 establishes electrical contact with every corresponding solder bump 220. Because all the solder bumps 220 are not uniform, some of the solder bumps 220 will be deformed more than others during this electrical contact initiation.

The probes 100 may be regarded as rigid probes 100 with reverse compliance because the probe tip 112 remains rigid at high forces but is free to move away from the substrate 120. During testing, based on thermal and/or mechanical stresses, if the solder bump 220 moves closer to the probe tip 112, the deflection of the solder bump 220 increases. If, on the other hand, the thermal and/or mechanical stresses during testing cause the solder bump 220 to move away from the probe tip 112, the previously deflected cantilever 115 moves back up and thereby facilitates continued contact between the probe tip 112 and the solder bump 220. Because of the reverse compliance of the cantilever 115, the probe tip 112 follows the movement of the solder bump 220 (toward and away from the probe tip 112) during testing such that the electrical contact between the probe tip 112 and solder bump 220 is maintained throughout the testing. Since the oxide layer on the solder bump 220 has already been pierced and electrical contact initiated, the force necessary to maintain contact is less, and is provided by the cantilever 115.

Again, when the entire array of solder bumps 220 of a given circuit under test 210 are considered, the importance of rigid probes with reverse compliance becomes even clearer. The array of solder bumps 220 of a circuit under test 210 may be non-uniform in size and non-parallel to the substrate 120 (non-planar). After each probe tip 112 contacts the substrate 120 and becomes a rigid probe, sufficient additional force is applied so that all the solder bumps 220 are compressed by the respective (rigid) probe tips 112. Because the solder bumps 220 are not elastic, less than 1 μm of movement can cause loss of contact between the solder bump 220 and corresponding probe tip 112. A large force is required to make initial contact to all the solder bumps 220, but only a relatively small force is required to maintain electrical contact. Thus, embodiments of the invention include a cantilever 115 with small force and small deflection designed into the small spaces between the solder bumps 220. As a result, if every probe tip 112 is not associated with a reverse compliant cantilever 115 that facilitates individual probe tips 112 following the movement of individual solder bumps 220 independently of other probes 100, only some of the probes 100 would maintain electrical contact with some of the solder bumps 220 during high power testing. While embodiments described herein discuss the circuit under test 210 as being lowered onto the probes 100 such that the deflection of the cantilever 115 is downward, other orientations are also contemplated. For example, if the probe tip 112 shown in FIG. 2 were oriented downward and the solder bump 220 were pushed up to initiate contact between the probe tip 112 and the solder bump 220, the cantilever 115 would be deflected up (still toward the substrate 120 on which the probes 100 are disposed) and may move back down, based on the subsequent movement of the solder bump 220, to maintain contact.

Figure 6:
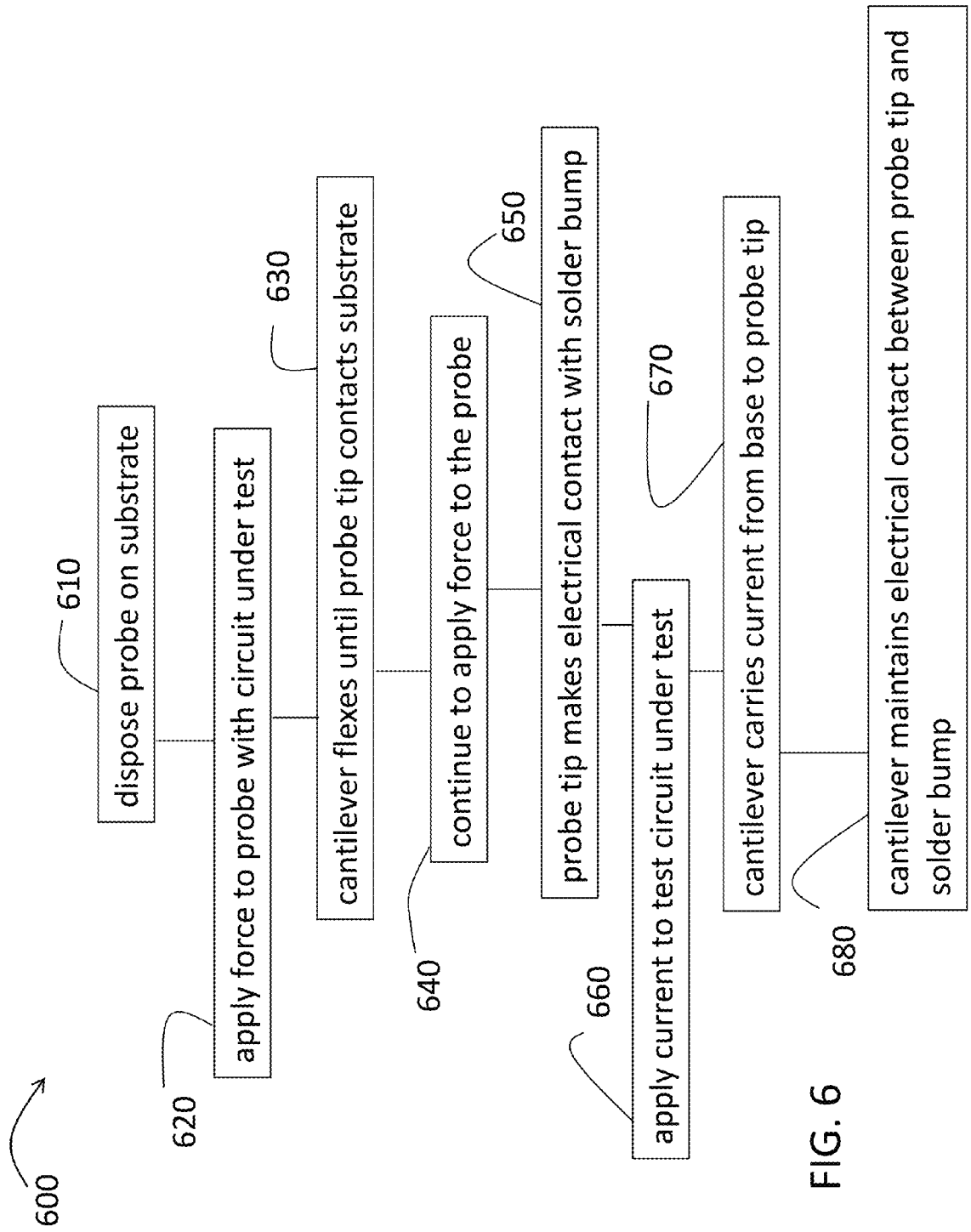
FIG. 6 is a flow diagram of an exemplary method of probing compressible bumped structures according to an embodiment of the invention.

FIG. 6 is a flow diagram of an exemplary method 400 of probing compressible bumped or column structures according to an embodiment of the invention. As discussed above, the compressible bumped structures may be solder bumps 220. Disposing the probe 100 on the substrate 120 (block 610) includes arranging adjacent probes 100 at a distance to accommodate the pitch of the circuit under test 210. At block 620, applying force to the probe 100 with the circuit under test 210 includes aligning each solder bump 220 with a corresponding probe tip 112 of a probe 100 and pushing against the probe tip 112 with the solder bump 220 of the circuit under test 210. The cantilever 115 flexes, in response to the force applied with the circuit under test 210, until the probe tip 112 contacts the substrate 120 (block 630). The method 400 also includes continuing to apply force to the probe 100 (to all the probes 100 on the substrate 120) to ensure that every probe tip 112 has contacted the substrate 120 (i.e. every cantilever has bottomed out (block 640). That is, when the probes 100 are rigid reverse compliant probes as discussed above with reference to the various embodiments of the invention, the cantilever 115 of each probe 100 is initially deflected in a direction away from the solder bump 220 into contact with the substrate 120 on which the probe 100 is attached at the base 110 as shown in FIG. 2. At block 440, applying additional force to the probes 100 causes the probe tip 112 to push into the corresponding solder bump 220. In this way, the probe tip 112 makes electrical contact with the solder bump 220 (block 650). At block 660, applying current and testing the circuit under test 210 includes via connections 130 (FIG. 1) supplying current to the probes 100 (bases 110) through the substrate 120. The cantilever 115 carries this current from the base 110 to the probe tip 112 (block 670) to conduct the testing by applying this current to the solder bump 220. When temperature changes result in movement of the solder bump, the cantilever maintains electrical contact between the probe tip 112 and the associated solder bump 220 (block 680) by flexing back toward the solder bump 220 as needed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A probe to conduct testing of a circuit, the probe comprising:
   a base coupled to a substrate;
   a cantilever attached to the base at a first end, the cantilever configured to deflect from a first position, in which a probe tip of the probe makes initial mechanical contact with a compliant bump of the circuit, to a second position in which a second end opposite the first end is in contact with the substrate and to move between the second position and the first position based on a movement of the compliant bump of the circuit; and
   the probe tip attached to the cantilever at the second end, the probe tip configured to maintain contact with the compliant bump of the circuit, wherein, based on additional forces applied after the initial mechanical contact, the cantilever is deformed to the second position and the compliant bump is deformed to establish electrical contact, wherein a thickness of the cantilever is between 2-5 μm, a length is between 110-150 μm, and a width is between 10-40 μm.

2. The probe according to claim 1, wherein the substrate includes via connections to supply current to the probe.

3. The probe according to claim 1, wherein a sizing of the cantilever is based on an amount of current to be carried to the probe tip.

4. The probe according to claim 1, wherein a distance between the probe and an adjacent probe is between 45 and 65 μm and a distance between the probe tip and an adjacent probe tip is between 35-70 μm.

5. The probe according to claim 1, wherein a shape of the probe tip is based on metallurgy of the probe tip and material comprising the compliant bump.

6. The probe according to claim 5, wherein the shape of the probe tip is also based on a desired deformation of the compliant bump.

7. The probe according to claim 1, wherein a height of the base determines a maximum distance between the first position and the second position.

8. The probe according to claim 1, wherein a maximum distance between the first position and the second position is less than a height of the base.

9. The probe according to claim 1, wherein a height of the base is between 3-7 μm, and a diameter of the base is between 10-40 μm.

10. The probe according to claim 1, wherein the compliant bump is a compressible bump, pad, or column structure.

11. The probe according to claim 10, wherein the compliant bump is a solder bump.

12. The probe according to claim 1, wherein the probe tip maintains contact with the compliant bump throughout the cantilever movement.

13. The probe according to claim 1, wherein when the probe tip initially makes mechanical contact with the compliant bump, the cantilever is in the first position.

14. The probe according to claim 13, wherein additional forces are applied after the initial mechanical contact to deform the cantilever to the second position and apply sufficient force to deform the compliant bump and establish electrical contact.

15. The probe according to claim 1, wherein based on thermal or mechanical stress, the compliant bump moves away from the substrate, and the cantilever moves toward the first position to maintain electrical contact between the probe tip and the compliant bump.

* * * * *